United States Patent
Sim et al.

(10) Patent No.: US 12,095,008 B2
(45) Date of Patent: Sep. 17, 2024

(54) LIGHT EMITTING ELEMENT, METHOD OF MANUFACTURING THE SAME, AND DISPLAY DEVICE INCLUDING THE SAME

(71) Applicant: Samsung Display Co., LTD., Yongin-si (KR)

(72) Inventors: Young Chul Sim, Yongin-si (KR); Hyung Rae Cha, Yongin-si (KR); Dong Uk Kim, Yongin-si (KR); Sung Ae Jang, Yongin-si (KR); Ji Hyun Ham, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 215 days.

(21) Appl. No.: 17/365,461

(22) Filed: Jul. 1, 2021

(65) Prior Publication Data

US 2022/0140191 A1    May 5, 2022

(30) Foreign Application Priority Data

Nov. 2, 2020  (KR) .................. 10-2020-0144794

(51) Int. Cl.
*H01L 33/40*    (2010.01)
*H01L 27/15*    (2006.01)
(Continued)

(52) U.S. Cl.
CPC .......... *H01L 33/325* (2013.01); *H01L 27/156* (2013.01); *H01L 33/005* (2013.01); *H01L 33/382* (2013.01); *H01L 33/42* (2013.01)

(58) Field of Classification Search
CPC . H01L 25/0753; H01L 25/167; H01L 27/156; H01L 33/005; H01L 33/007;
(Continued)

(56) References Cited

U.S. PATENT DOCUMENTS 7,910,154 B2   3/2011  Park
8,476,088 B2   7/2013  Lee et al.
(Continued)

FOREIGN PATENT DOCUMENTS

JP        4989978      8/2012
KR     2000-0008284    2/2000
(Continued)

OTHER PUBLICATIONS

Torvik ("III-Nitride Semiconductors: Electrical, Structural and Defects Properties" 2000, pp. 17-49, Chapter 2) (Year: 2000).*
(Continued)

*Primary Examiner* — Matthew C Landau
*Assistant Examiner* — Dmitriy Yemelyanov
(74) *Attorney, Agent, or Firm* — KILE PARK REED & HOUTTEMAN PLLC

(57) ABSTRACT

A light emitting element includes a first semiconductor layer including a first type of semiconductor, the first semiconductor layer including a 1-1-th semiconductor layer and a 1-2-th semiconductor layer, which are arranged in a length direction of the light emitting element; a second semiconductor layer including a second type of semiconductor different from the first type; an active layer disposed between the 1-2-th semiconductor layer and the second semiconductor layer; and an intermediate layer disposed between the 1-1-th semiconductor layer and the 1-2-th semiconductor layer and having a porous structure.

17 Claims, 14 Drawing Sheets

(51) Int. Cl.
*H01L 33/00* (2010.01)
*H01L 33/32* (2010.01)
*H01L 33/38* (2010.01)
*H01L 33/42* (2010.01)

(58) Field of Classification Search
CPC ..... H01L 33/025; H01L 33/16; H01L 33/325; H01L 33/382; H01L 33/42
See application file for complete search history.

(56) References Cited

U.S. PATENT DOCUMENTS

| | | | |
|---|---|---|---|
| 9,397,479 | B2 | 7/2016 | Lee et al. |
| 9,543,470 | B2 | 1/2017 | Hwang et al. |
| 2017/0005242 | A1* | 1/2017 | Kim ..................... H01L 33/46 |
| 2017/0237234 | A1* | 8/2017 | Han .................. H01S 5/18361 |
| | | | 372/45.012 |
| 2021/0057601 | A1* | 2/2021 | Oliver .................. H01L 33/025 |
| 2021/0167050 | A1 | 6/2021 | Cho et al. |

FOREIGN PATENT DOCUMENTS

| | | |
|---|---|---|
| KR | 10-1007086 | 1/2011 |
| KR | 10-1038923 | 6/2011 |
| KR | 10-1272833 | 6/2013 |
| KR | 10-1550200 | 9/2015 |
| KR | 10-2017-0063919 | 6/2017 |
| KR | 10-2020-0021014 | 2/2020 |

OTHER PUBLICATIONS

Guo-Yi Shiu et al., "InGaN Light-Emitting Diodes with an Embedded Nanoporous GaN Distributed Bragg Reflectors", Scientific Reports, Jul. 1, 2016, pp. 1-8.

International Search Report corresponding to International Application No. PCT/KR2021/011468 dated Dec. 10, 2021.

* cited by examiner

LIGHT EMITTING ELEMENT, METHOD OF MANUFACTURING THE SAME, AND DISPLAY DEVICE INCLUDING THE SAME

CROSS-REFERENCE TO RELATED APPLICATION(S)

The application claims priority to and the benefit of Korean Patent Application No. 10-2020-0144794 under 35 U.S.C. § 119, filed in the Korean Intellectual Property Office (KIPO) on Nov. 2, 2020, the entire contents of which are incorporated herein by reference.

BACKGROUND

1. Technical Field

The disclosure relates to a light emitting element, a method of manufacturing the same, and a display device including the same.

2. Description of Related Art

In recent years, as interest in information displays is increasing, research and development on display devices are continuously conducted.

SUMMARY

An object of the disclosure is to provide a light emitting element in which light emitting efficiency is improved and a degree of freedom in selecting a material of an electrode can be secured, a method of manufacturing the same, and a display device including the same.

Objects of the disclosure are not limited to the above-described object, and other objects not mentioned will be clearly understood by those skilled in the art from the following description.

According to an embodiment of the disclosure, a light emitting element may be provided. The light emitting element may include a first semiconductor layer including a first type of semiconductor, the first semiconductor layer including a 1-1-th semiconductor layer and a 1-2-th semiconductor layer, which are arranged in a length direction of the light emitting element; a second semiconductor layer including a second type of semiconductor different from the first type; an active layer disposed between the 1-2-th semiconductor layer and the second semiconductor layer; and an intermediate layer disposed between the 1-1-th semiconductor layer and the 1-2-th semiconductor layer and having a porous structure.

The intermediate layer may include a first doped layer doped with a dopant having a first concentration; and a second doped layer doped with a dopant having a second concentration less than the first concentration.

The first doped layer and the second doped layer may be alternately arranged in the length direction.

The intermediate layer may include at least one of GaN, InGaN, and InN.

A thickness of the first doped layer may be greater than a thickness of the second doped layer.

The first concentration may be 10 times the second concentration or more.

The first concentration may be $10^{18}$ cm$^{-3}$ or more, and the second concentration may be $10^{17}$ cm$^{-3}$ or less.

The first doped layer may have a first thickness ($T_1$) that satisfies Equation 1, and the second doped layer may have a second thickness ($T_2$) that satisfies Equation 2. Equation 1 may be defined as follows:

$$T_1 = \frac{\lambda m}{4n_1}$$

wherein $n_1$ is a refractive index of the first doped layer, $\lambda$ is a wavelength [nm] of light emitted from the active layer, $m=2h_1-1$, and $h_1$ is an integer greater than or equal to 1, and Equation 2 may be defined as follows:

$$T_2 = \frac{\lambda m}{4n_2}$$

wherein $n_2$ is a refractive index of the second doped layer, $\lambda$ is the wavelength [nm] of the light emitted from the active layer, $m=2h_2-1$, and $h_2$ is an integer greater than or equal to 1.

A thickness of the intermediate layer may be in a range of about 1 μm to about 2 μm.

The sum of thicknesses of the intermediate layer, the 1-1-th semiconductor layer, and the 1-2-th semiconductor layer may be 3 μm or more.

The intermediate layer may reflect light emitted from the active layer in a direction from the first semiconductor layer toward the second semiconductor layer.

According to another embodiment of the disclosure, a method of manufacturing a light emitting element may be provided. The method of manufacturing a light emitting element may include preparing a stacked substrate; disposing a 1-1-th semiconductor layer including a first type of semiconductor on the stacked substrate; disposing an intermediate layer on the 1-1-th semiconductor layer; disposing a 1-2-th semiconductor layer including the first type of semiconductor on the intermediate layer; disposing an active layer on the 1-2-th semiconductor layer; disposing a second semiconductor layer including a second type of semiconductor different from the first type on the active layer; removing at least a portion of each of the 1-1-th semiconductor layer, the intermediate layer, the 1-2-th semiconductor layer, the active layer, and the second semiconductor layer in a direction from the second semiconductor layer toward the 1-2-th semiconductor layer; and performing an electrochemical etching process on the intermediate layer to form a porous structure in the intermediate layer.

The disposing of the intermediate layer may include disposing a first doped layer doped with a dopant having a first concentration; and disposing a second doped layer doped with a dopant having a second concentration less than the first concentration.

The first doped layer may have a first thickness ($T_1$) that satisfies Equation 1, and the second doped layer may have a second thickness ($T_2$) that satisfies Equation 2. Equation 1 may be defined as follows:

$$T_1 = \frac{\lambda m}{4n_1}$$

wherein $n_1$ is a refractive index of the first doped layer, $\lambda$ is a wavelength [nm] of light emitted from the active layer, m=2h₁−1, and h₁ is an integer greater than or equal to 1, and Equation 2 may be defined as follows:

$$T_2 = \frac{\lambda m}{4n_2}$$

wherein $n_2$ is a refractive index of the second doped layer, λ is the wavelength [nm] of the light emitted from the active layer, m=2h₂−1, and h₂ is an integer greater than or equal to 1.

The first doped layer and the second doped layer may be formed by epitaxial growth.

The electrochemical etching process may be performed through the side surface of the intermediate layer and may be selectively performed on the first doped layer.

A thickness of the intermediate layer may be in a range of about 1 µm to about 2 µm.

According to still another embodiment of the disclosure, a display device may be provided. The display device may include a substrate; and a display element part including a light emitting element disposed on the substrate and emitting light, a first contact electrode electrically connected to an end of the light emitting element, and a second contact electrode electrically connected to another end of the light emitting element. The light emitting element may include a first semiconductor layer including a first type of semiconductor, the first semiconductor layer including a 1-1-th semiconductor layer and a 1-2-th semiconductor layer, which are arranged in a length direction of the light emitting element; a second semiconductor layer including a second type of semiconductor different from the first type; an active layer disposed between the 1-2-th semiconductor layer and the second semiconductor layer; and an intermediate layer disposed between the 1-1-th semiconductor layer and the 1-2-th semiconductor layer and having a porous structure.

The first contact electrode may include an opaque conductive material and may be electrically connected to the 1-1-th semiconductor layer, and the second contact electrode may include a transparent conductive material and may be electrically connected to the 1-2-th semiconductor layer.

The intermediate layer may include a first doped layer doped with a dopant having a first concentration; and a second doped layer doped with a dopant having a second concentration less than the first concentration.

Means for solving the technical problems of the disclosure are not limited to the above-described solutions. Solutions that are not mentioned may be clearly understood by those skill in the art from the specification and the accompanying drawings.

BRIEF DESCRIPTION OF THE DRAWINGS

The accompanying drawings, which are included to provide a further understanding of the disclosure, and are incorporated in and constitute a part of this specification, illustrate embodiments of the disclosure, and, together with the description, serve to explain principles of the disclosure.

DETAILED DESCRIPTION OF THE EMBODIMENTS

Figure 1:
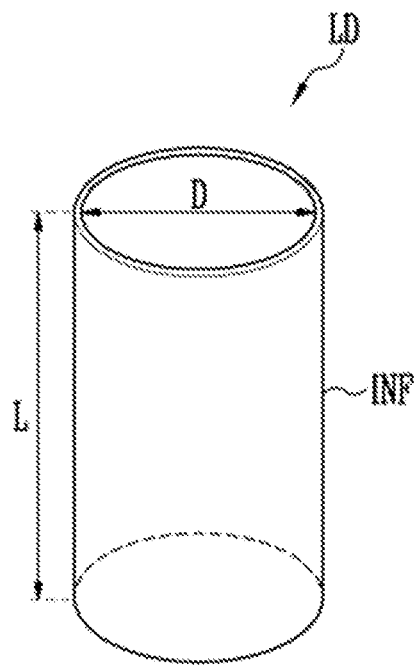
FIGS. 1 and 2 are a perspective view and a cross-sectional view schematically illustrating a light emitting element according to an embodiment of the disclosure.

The embodiments described in the specification are intended to clearly explain the spirit of the disclosure to those skilled in the art to which the disclosure pertains. Therefore, the disclosure is not limited by the embodiments described herein. The scope of the disclosure should be construed as including modifications or variations that do not depart from the spirit of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

In the specification and the claims, the phrase "at least one of" is intended to include the meaning of "at least one selected from the group of" for the purpose of its meaning and interpretation. For example, "at least one of A and B" may be understood to mean "A, B, or A and B."

The drawings attached to the specification are for easily explaining the disclosure. Shapes of the components shown in the drawings may be exaggerated and displayed as necessary to aid understanding of the disclosure. Therefore, the disclosure is not limited by the drawings.

In the specification, when it is determined that a detailed description of a well-known configuration or function related to the disclosure may obscure the subject matter of the disclosure, a detailed description thereof will be omitted as necessary.

The disclosure relates to a light emitting element, a method of manufacturing the same, and a display device including the same.

Hereinafter, a light emitting element, a method of manufacturing the same, and a display device including the same according to embodiments of the invention will be described with reference to FIGS. 1 to 18.

Figure 2:
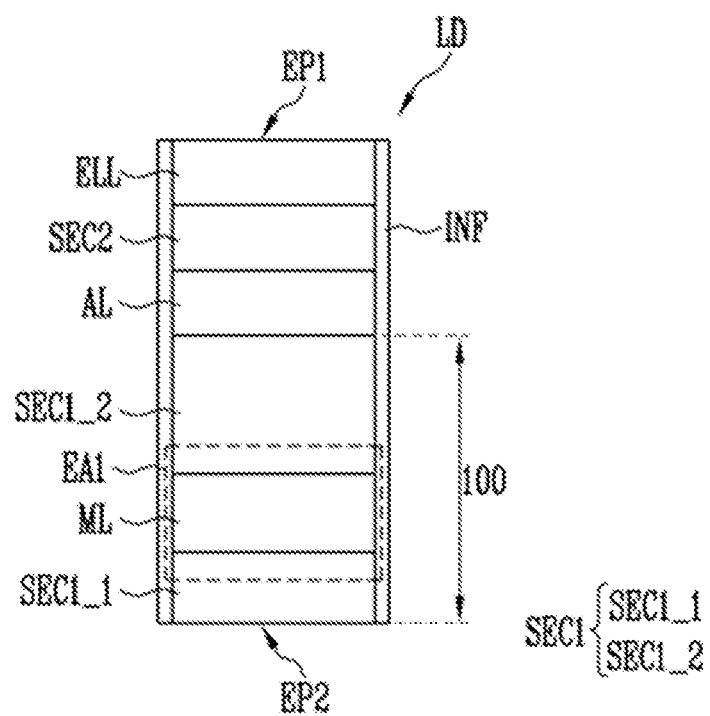
Figure 3:
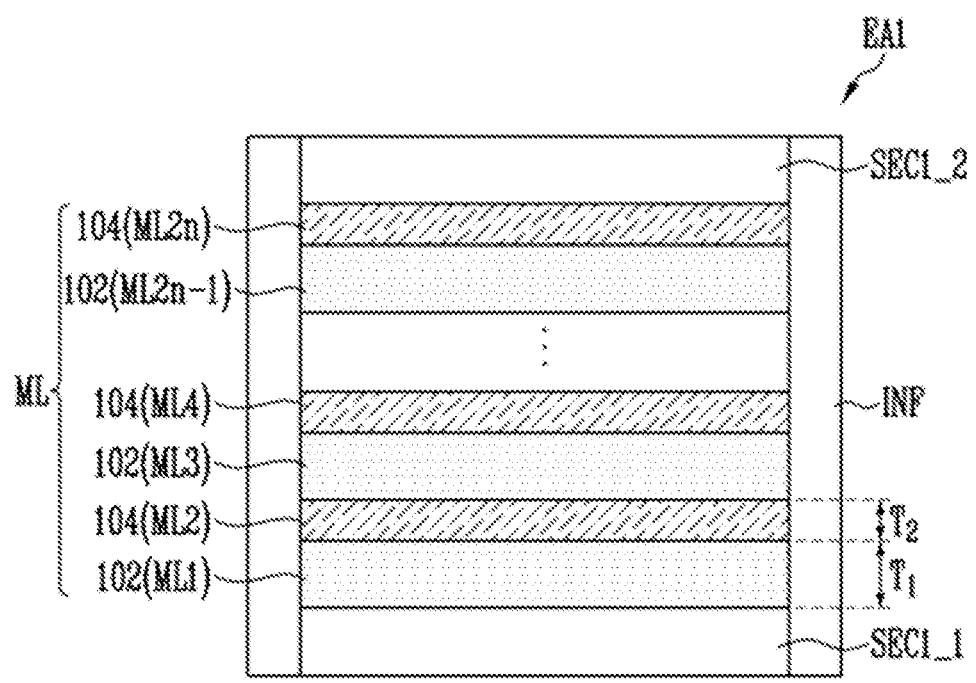
FIG. 3 is an enlarged view schematically illustrating an area EA1 of FIG. 2.

FIG. 1 is a schematic perspective view illustrating a light emitting element according to an embodiment. FIG. 2 is a schematic cross-sectional view illustrating the light emitting element according to an embodiment. FIGS. 1 and 2 illustrate a light emitting element (or light emitting diode) LD having a columnar shape, but the type and/or shape of the light emitting element LD is not limited thereto. FIG. 3 is a schematic enlarged view illustrating area EA1 of FIG. 2.

Referring to FIGS. 1 and 2, the light emitting element LD may include a first semiconductor layer SEC1, an intermediate layer ML, an active layer AL, a second semiconductor layer SEC2, and an electrode layer ELL. The first semiconductor layer SEC1 may include a 1-1-th semiconductor layer SEC1_1 and a 1-2-th semiconductor layer SEC1_2. For example, if the direction in which the light emitting element LD extends is referred to as a length (L) direction, the light emitting element LD may include the 1-1-th semiconductor layer SEC1_1, the intermediate layer ML, the 1-2-th semiconductor layer SEC1_2, the active layer AL, the second semiconductor layer SEC2, and the electrode layer ELL sequentially stacked in the length L direction.

The light emitting element LD may be provided in a columnar shape extending in a direction. The light emitting element LD may include a first end EP1 and a second end EP2. The first end EP1 of the light emitting element LD may be adjacent to one of the first semiconductor layer SEC1 and the second semiconductor layer SEC2. The second end EP2 of the light emitting element LD may be adjacent to the other of the first semiconductor layer SEC1 and the second semiconductor layer SEC2.

According to an embodiment, the light emitting element LD may be a light emitting element manufactured in the columnar shape by an etching method or the like. In the specification, the columnar shape may include a rod-like shape or a bar-like shape that is elongated in the length L direction (for example, having an aspect ratio greater than 1), such as a circular column or polygonal column, and the shape of the cross section is not particularly limited. For example, the length L of the light emitting element LD may be greater than a diameter D (or a width of the cross section).

The light emitting element LD may have a size in a range of about a nanoscale to about a microscale. For example, the light emitting element LD may have the diameter D (or width) and/or length L ranging from a nanoscale to a microscale. However, the size of the light emitting element LD is not limited thereto. The size of the light emitting element LD may be variously changed according to design conditions of various devices (for example, a display device) using, as a light source, a light emitting device having the light emitting element LD.

The first semiconductor layer SEC1 may be a first conductivity type semiconductor layer. For example, the first semiconductor layer SEC1 may include an N-type semiconductor layer. As an example, the first semiconductor layer SEC1 may include the N-type semiconductor layer including a semiconductor material of InAlGaN, GaN, AlGaN, InGaN, AlN, and InN, and doped with a first conductivity type dopant such as Si, Ge, Sn, or the like. However, the material forming (or constituting) the first semiconductor layer SEC1 is not limited thereto, and the first semiconductor layer SEC1 may be formed of various other materials.

As described above, the first semiconductor layer SEC1 may include the 1-1-th semiconductor layer SEC1_1 and the 1-2-th semiconductor layer SEC1_2. According to an example, a thickness of the 1-1-th semiconductor layer SEC1_1 may be thinner than that of the 1-2-th semiconductor layer SEC1_2. The concentration of the dopant used to dope the 1-1-th semiconductor layer SEC1_1 may be less than that of the dopant used to dope the 1-2-th semiconductor layer SEC1_2. The dopant concentration and thickness of each of the 1-1-th semiconductor layer SEC1_1 and the 1-2-th semiconductor layer SEC1_2 are not limited to those of the above-described embodiment.

The intermediate layer ML may be positioned between the 1-1-th semiconductor layer SEC1_1 and the 1-2-th semiconductor layer SEC1_2. The intermediate layer ML may be interposed between N-type semiconductor layers. At least one surface of the intermediate layer ML may be covered or overlapped by an insulating film INF.

Referring to FIG. 3, the intermediate layer ML may include layers. The layers included in the intermediate layer ML may be distinguished by the concentration of the dopant used to dope the layers. The intermediate layer ML may include a first doped layer 102 and a second doped layer 104. Each of the first doped layer 102 and the second doped layer 104 may include an N-type semiconductor layer including a semiconductor material of GaN, InGaN, and InN, and doped with the first conductivity type dopant such as Si, Ge, Sn, or the like. Each of the first doped layer 102 and the second doped layer 104 may not include InAlGaN, AlGaN, and/or AlN. According to an example, the intermediate layer ML may include GaN. Compared with the case of including InAlGaN, AlGaN, and/or AlN, the quality of epitaxial growth of the intermediate layer ML can be improved.

The concentration of the dopant used to dope the first doped layer 102 may be relatively higher than that of the dopant used to dope the second doped layer 104. The first doped layer 102 may be doped with the dopant having a first concentration, and the second doped layer 104 may be doped with the dopant having a second concentration less than the first concentration. For example, the concentration of the dopant used to dope the first doped layer 102 may be $10^{18}$ cm$^{-3}$ or more, and the concentration of the dopant used to dope the second doped layer 104 may be $10^{17}$ cm$^{-3}$ or less. As another example, the concentration of the dopant used to dope the first doped layer 102 may be $10^{19}$ cm$^{-3}$ or more, and the concentration of the dopant used to dope the second doped layer 104 may be $5\times10^{16}$ cm$^{-3}$ or less. As another example, the concentration of the dopant used to dope the first doped layer 102 may be 10 times or more of the concentration of the dopant used to dope the second doped layer 104.

The first doped layer 102 and the second doped layer 104 may be alternately arranged with each other. For example, the intermediate layer ML may include a first intermediate layer ML1, a second intermediate layer ML2, a third intermediate layer ML3, a fourth intermediate layer ML4, a 2n-1-th intermediate layer ML2n-1, and a 2n-th intermediate layer ML2n sequentially disposed adjacent to the 1-1-th semiconductor layer SEC1_1 (where n is an integer). The first intermediate layer ML1, the third intermediate layer ML3, and the 2n-1-th intermediate layer ML2n-1 may be the first doped layers 102, respectively. The second intermediate layer ML2, the fourth intermediate layer ML4, and the 2n-th intermediate layer ML2n may be the second doped layers 104, respectively. However, the disclosure is not limited thereto. According to an embodiment, the first intermediate layer ML1, the third intermediate layer ML3, and the 2n-1-th intermediate layer ML2n-1 may be the second doped layers 104, respectively. The second intermediate layer ML2, the fourth intermediate layer ML4, and the 2n-th intermediate layer ML2n may be the first doped layers 102, respectively.

The first doped layer 102 may have a porous structure. The second doped layer 104 may not have the porous structure. Accordingly, the intermediate layer ML may have a structure in which a layer having the porous structure and a layer not having the porous structure are alternately arranged with each other.

The intermediate layer ML may have a structure in which layers having different refractive indices are alternately arranged. A refractive index of the first doped layer 102 having the porous structure may be lower than that of the second doped layer 104 not having the porous structure. Since the first doped layer 102 and the second doped layer 104 are alternately arranged, a layer having a relatively high refractive index and a layer having a relatively low refractive index may be alternately positioned.

The intermediate layer ML may be a reflector configured to reflect light. According to an example, the intermediate layer ML may be a Distributed Bragg reflector (DBR). As described above, each of the first doped layer 102 and the second doped layer 104 may not include InAlGaN, AlGaN, and/or AlN. Accordingly, the intermediate layer ML may have a structure of the Distributed Bragg reflector not including InAlGaN, AlGaN, and/or AlN.

The first doped layer 102 may have a first thickness $T_1$. The first thickness $T_1$ may satisfy Equation 1 below.

$$T_1 = \frac{\lambda m}{4n_1} \quad \text{[Equation 1]}$$

Here, $n_1$ is a refractive index of the first doped layer 102, $\lambda$ is a wavelength [nm] of light emitted from the active layer AL, $m=2h_1-1$, and $h_1$ is an integer greater than or equal to 1.

The second doped layer 104 may have a second thickness $T_2$. The second thickness $T_2$ may satisfy Equation 2 below.

$$T_2 = \frac{\lambda m}{4n_2} \quad \text{[Equation 2]}$$

Here, $n_2$ is a refractive index of the second doped layer 104, $\lambda$ is the wavelength [nm] of the light emitted from the active layer AL, $m=2h_2-1$, and $h_2$ is an integer greater than or equal to 1.

For example, light having a wavelength of about 440 nm to about 495 nm may be emitted from the active layer AL, the first doped layer 102 may have a refractive index of about 1.02, and the second doped layer 104 may have a refractive index of about 2.46. A thickness of the first doped layer 102 and a thickness of the second doped layer 104 may be calculated according to a value of h selected according to design conditions. For $h_1=1$, the first doped layer 102 may have a thickness of about 107 nm to about 122 nm according to Equation 1 above. For $h_1=2$, the first doped layer 102 may have a thickness of about 323 nm to about 364 nm according to Equation 1 above. Likewise, for $h_2=1$, the second doped layer 104 may have a thickness of about 44 nm to about 51 nm according to Equation 2 above. For $h_2=2$, the second doped layer 104 may have a thickness of about 134 nm to about 151 nm according to Equation 2 above. However, the thickness of the first doped layer 102 and the thickness of the second doped layer 104 are not limited to the thickness values presented as examples. According to an example, the first thickness T1 may be greater than the second thickness T2.

The light emitted from the active layer AL may be provided to the intermediate layer ML. Because of different refractive indices of the first doped layer 102 and the second doped layer 104 included in the intermediate layer ML, a phenomenon in which the light provided from the active layer AL is reflected at an interface between the first doped layer 102 and the second doped layer 104 may occur. Interfaces between the first doped layer 102 and the second doped layer 104 may be provided in the intermediate layer ML. As the first doped layer 102 having the first thickness $T_1$ and the second doped layer 104 having the second thickness $T_2$ are provided, constructive interference between reflected rays of lights may occur at each interface between the first doped layer 102 and the second doped layer 104. Accordingly, loss of the provided light may be prevented.

The intermediate layer ML may have a reflectance. According to an example, the reflectance of the intermediate layer ML may be close to that of a metal. For example, the reflectance of the intermediate layer ML may be about 80% to about 95%. As the numbers of the first doped layer 102 and the second doped layer 104 increase, the reflectance may be increased because of an increase in the thickness of the intermediate layer ML.

According to an example, the thickness of the intermediate layer ML may be about 1 μm to about 2 μm. The sum 100 of lengths of the first semiconductor layer SEC1 and the intermediate layer ML may be about 3 μm or more. As another example, the sum 100 of the lengths of the first semiconductor layer SEC1 and the intermediate layer ML may be about 4 μm or more.

The active layer AL may be positioned between the 1-2-th semiconductor layer SEC1_2 and the second semiconductor layer SEC2. The active layer AL may be formed in a single-quantum well or multi-quantum well structure.

According to an embodiment, a cladding layer (not shown) doped with a conductive dopant may be formed on and/or under the active layer AL. For example, the cladding layer may be formed of AlGaN or InAlGaN. According to an embodiment, materials such as AlGaN and InAlGaN may be used to form the active layer AL, and various other materials may form the active layer AL.

The second semiconductor layer SEC2 may be disposed on the active layer AL and may include a semiconductor layer of a different type from the first semiconductor layer SEC1. For example, the second semiconductor layer SEC2 may include a P-type semiconductor layer. For example, the second semiconductor layer SEC2 may include the P-type semiconductor layer including at least one semiconductor material of InAlGaN, GaN, AlGaN, InGaN, AlN, and InN and doped with a second conductivity type dopant such as Mg. However, the material constituting the second semiconductor layer SEC2 is not limited thereto, and the second semiconductor layer SEC2 may be formed of various other materials.

The electrode layer ELL may be formed on the second semiconductor layer SEC2. The electrode layer ELL may include a metal or metal oxide. According to an example, the electrode layer ELL may include at least one of Cr, Ti, Al, Au, Ni, ITO, IZO, ITZO, and an oxide or alloy thereof.

In case that a voltage higher than a threshold voltage is applied to both ends of the light emitting element LD, light may be emitted from the light emitting element LD while electron-hole pairs are coupled in the active layer AL. By controlling the emission of the light emitting element LD using this principle, the light emitting element LD may be used as a light source of various light emitting devices including pixels of a display device.

The light emitting element LD may further include the insulating film INF provided on the surface of the light emitting element LD. The insulating film INF may be formed on the surface of the light emitting element LD to surround at least the outer peripheral surface of the active layer AL. The insulating film INF may further surround an area of each of the first and second semiconductor layers SEC1 and SEC2, and an area of the electrode layer ELL.

The insulating film INF may include an insulating material. According to an example, the insulating layer INF may include at least one insulating material of silicon oxide ($SiO_x$), silicon nitride ($SiN_x$), silicon oxynitride ($SiO_xN_y$), aluminum oxide ($AlO_x$), and titanium oxide ($TiO_x$) and may include a single layer or multiple layers (for example, a double layer including aluminum oxide ($AlO_x$) and silicon oxide ($SiO_x$)). However, the disclosure is not limited thereto. According to an embodiment, the insulating film INF may be omitted.

The insulating film INF may prevent an electrical short that may occur in case that the active layer AL electrically contacts conductive materials other than the first and second semiconductor layers SEC1 and SEC2. The insulating film INF may improve the lifespan and efficiency of the light emitting element LD by reducing or minimizing surface defects of the light emitting element LD. In case that light emitting elements LD are provided and disposed adjacent to each other, the insulating film INF may prevent a short circuit that may occur between the light emitting elements LD.

A light emitting device including the light emitting element LD described above can be used in various types of devices requiring a light source, including a display device. For example, light emitting elements LD may be disposed in each pixel of a display panel, and the light emitting elements LD may be used as the light source of each pixel. However, the field of application of the light emitting element LD is not limited to the above-described example. For example, the light emitting element LD may be used in other types of devices requiring a light source, such as a lighting device.

Hereinafter, a method of manufacturing a light emitting element according to an embodiment will be described in detail with reference to FIGS. 4 to 16.

FIGS. 4 to 16 are schematic cross-sectional views for explaining a method of manufacturing a light emitting element according to an embodiment.

Figure 4:
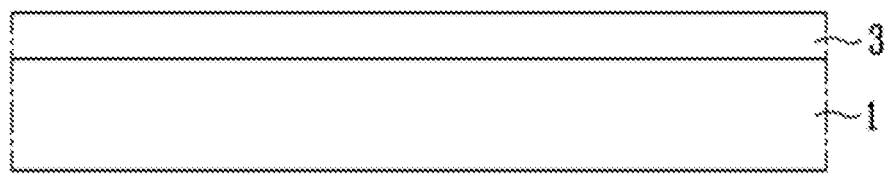
FIGS. 4 to 16 are cross-sectional views for explaining a method of schematically manufacturing a light emitting element according to an embodiment of the disclosure.

Referring to FIG. 4, a stacked substrate 1 may be prepared, and a sacrificial layer 3 may be formed on the stacked substrate 1.

The stacked substrate 1 may be a base plate for stacking target materials. The stacked substrate 1 may be a wafer for epitaxial growth of a material. According to an example, the stacked substrate 1 may be one of a sapphire substrate, a GaAs substrate, a Ga substrate, and an InP substrate, but the embodiments are not limited thereto. For example, in case that a specific material satisfies the selectivity for manufacturing a light emitting element LD and the material can epitaxially grow smoothly, the specific material may be selected as the material of the stacked substrate 1. The surface of the stacked substrate 1 may be flat. The shape of the stacked substrate 1 may be a polygonal shape including a rectangle, or a circular shape, but is not limited thereto.

The sacrificial layer 3 may be provided on the stacked substrate 1. The sacrificial layer 3 may physically separate the light emitting element LD from the stacked substrate 1 while the light emitting element LD is manufactured. The sacrificial layer 3 may include one of GaAs, AlAs, and AlGaAs. The sacrificial layer 3 may be formed by a method of a metal organic chemical vapor deposition (MOCVD), a molecular-beam epitaxy (MBE), a vapor-phase epitaxy (VPE), and a liquid-phase epitaxy (LPE). However, the step of forming the sacrificial layer 3 on the stacked substrate 1 may be omitted depending on the selection of the process for manufacturing the light emitting element LD.

Figure 5:
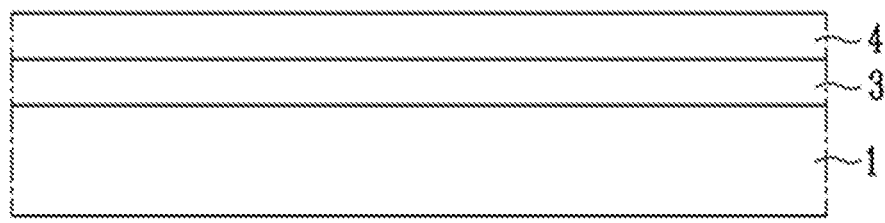

Referring to FIG. 5, a buffer layer 4 may be formed on the sacrificial layer 3. The buffer layer 4 may include one of InAlGaN, GaN, AlGaN, InGaN, AlN, and InN. The buffer layer 4 may be arranged between a first semiconductor layer SEC1 to be stacked thereafter and the sacrificial layer 3 to improve the crystallinity of the first semiconductor layer SEC1.

Figure 6:
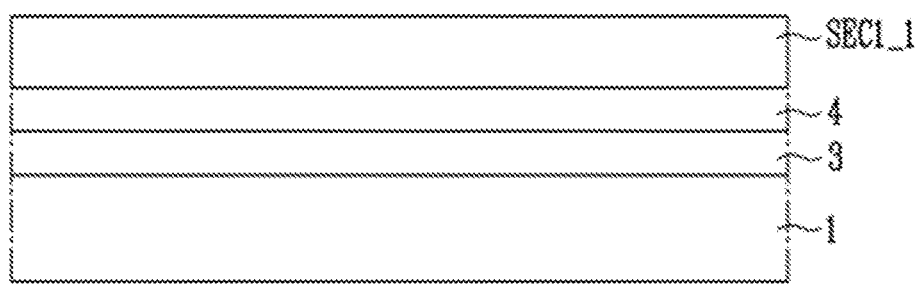

Referring to FIG. 6, a 1-1-th semiconductor layer SEC1_1 may be formed on the buffer layer 4. The 1-1-th semiconductor layer SEC1_1 may be formed by the epitaxial growth and may be formed by one of the methods listed as the method for forming the sacrificial layer 3.

Figure 7:
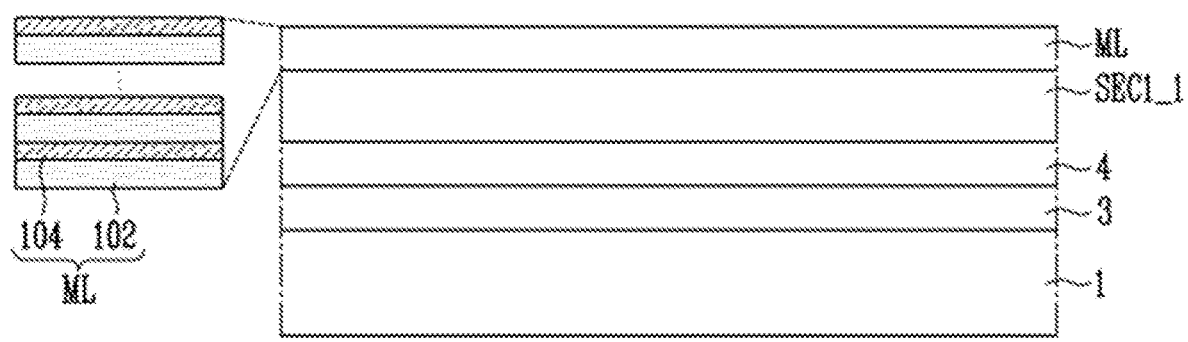

Referring to FIG. 7, an intermediate layer ML may be positioned on the 1-1-th semiconductor layer SEC1_1. Similar to the 1-1-th semiconductor layer SEC1_1, the intermediate layer ML may be formed by the epitaxial growth. A first doped layer 102 and a second doped layer 104 may be alternately formed on the 1-1-th semiconductor layer SEC1_1. For example, the step of forming the intermediate layer ML may include forming the first doped layer 102 on the first semiconductor layer SEC1_1 and forming the second doped layer 104 on the first doped layer 102. The thickness at which each of the first doped layer 102 and the second doped layer 104 grows may be defined by Equations 1 and 2 described above with reference to FIG. 3.

Figure 8:
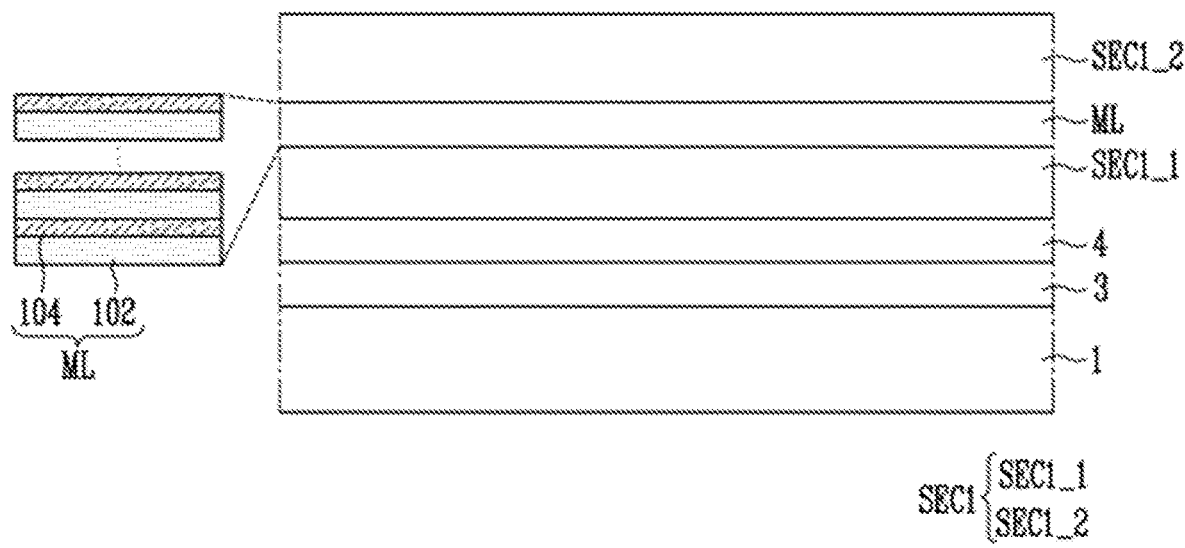

Referring to FIG. 8, a 1-2-th semiconductor layer SEC1_2 may be formed on the intermediate layer ML. The 1-2-th semiconductor layer SEC1_2 may be formed by the epitaxial growth and may be formed by one of the methods listed as the method for forming the sacrificial layer 3.

Figure 9:
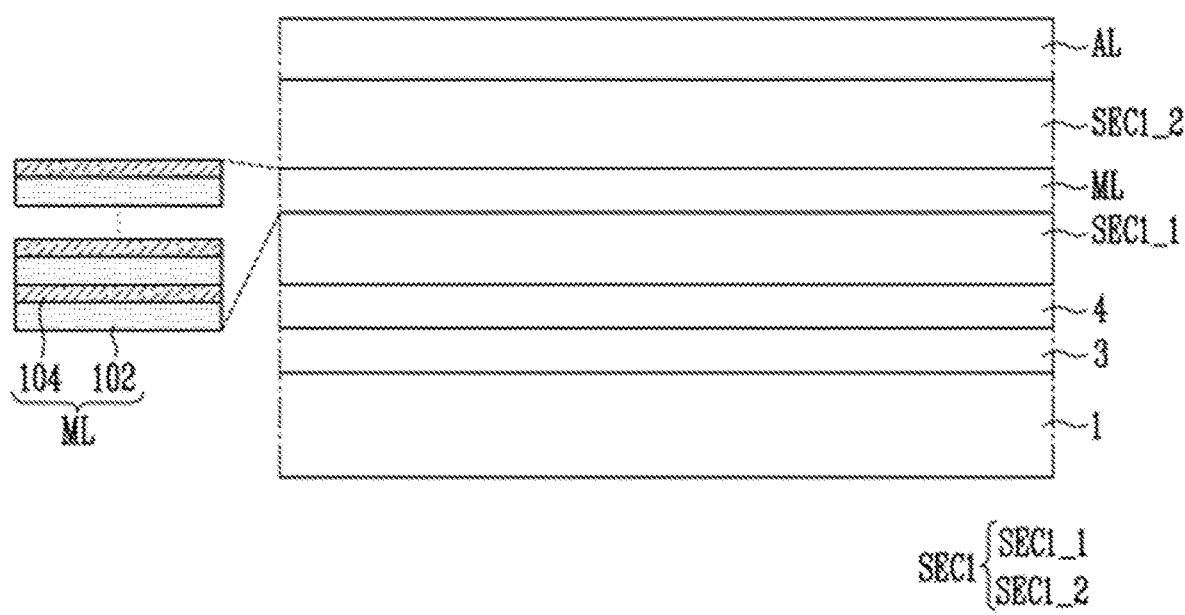

Referring to FIG. 9, an active layer AL may be formed on the 1-2-th semiconductor layer SEC1_2. The active layer AL may emit light having a wavelength in a range of about 400 nm to about 900 nm.

Figure 10:
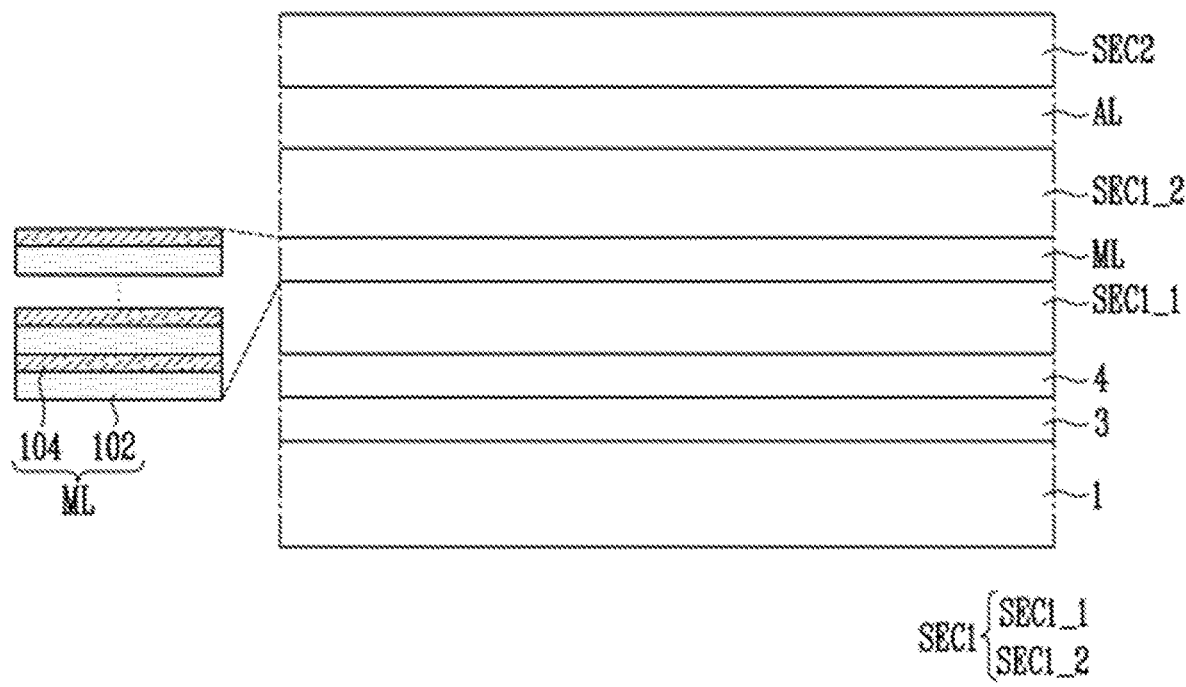

Referring to FIG. 10, a second semiconductor layer SEC2 may be formed on the active layer AL. The second semiconductor layer SEC2 may be formed of a semiconductor layer of at least a different type from the first semiconductor layer SEC1. As a result, the active layer AL may be positioned between the 1-2-th semiconductor layer SEC1_2 and the second semiconductor layer SEC2 having different polarities, and the light may be emitted from the active layer AL in case that electrical information of a predetermined voltage or higher is provided to both ends of the light emitting element LD.

Figure 11:
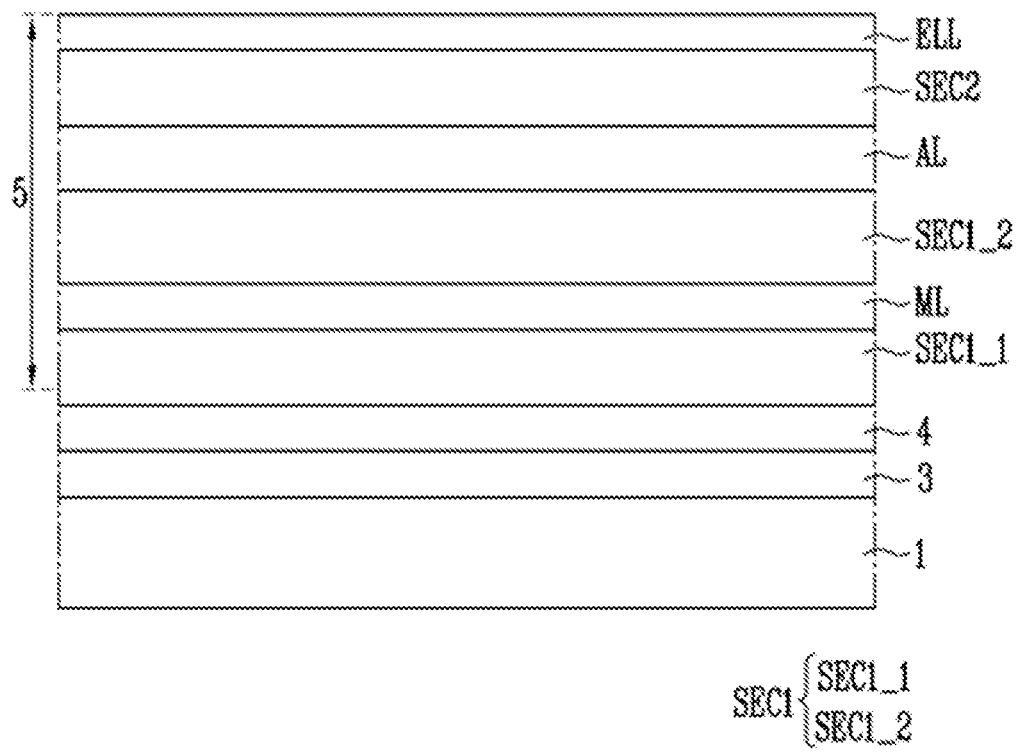

Referring to FIG. 11, an electrode layer ELL may be formed on the second semiconductor layer SEC2. The electrode layer ELL may include one of the materials described above with reference to FIGS. 1 and 2. The electrode layer ELL may minimize loss of the light output from the active layer AL and emitted to the outside of the light emitting element LD and may improve a current spreading effect on the second semiconductor layer SEC2. According to an example, the electrode layer ELL may include a transparent metal oxide such as indium tin oxide (ITO).

As described above, the 1-1-th semiconductor layer SEC1_1, the intermediate layer ML, the 1-2-th semiconductor layer SEC1_2, the active layer AL, the second semiconductor layer SEC2, and the electrode layer ELL sequentially stacked on the stacked substrate 1, the sacrificial layer 3, and the buffer layer 4 may form a light emitting stacked structure 5.

Figure 12:
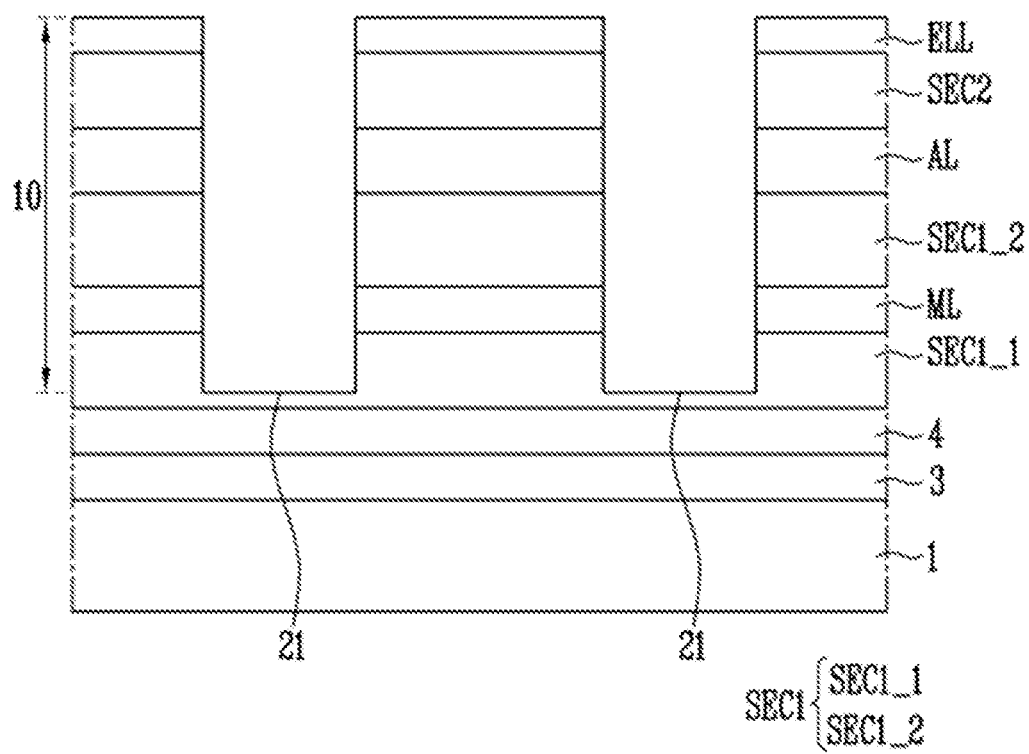

Referring to FIG. 12, the light emitting stacked structure 5 may be etched in a stacking direction to form a light emitting stacked pattern 10. The light emitting stacked pattern 10 may correspond to a range etched and removed in the stacking direction and may mean a structure in which the 1-1-th semiconductor layer SEC1_1, the intermediate layer ML, the 1-2-th semiconductor layer SEC1_2, the active layer AL, the second semiconductor layer SEC2, and the electrode layer ELL are sequentially arranged. The stacking direction may mean a direction perpendicular to a main surface of the stacked substrate 1.

In order to form the light emitting stacked pattern 10, a mask (not shown) may be disposed on an entire surface of the light emitting stacked structure 5, and an etching process may be performed to perform patterning at nanoscale or microscale intervals.

A dry etching method may be applied to the etching process for forming the light emitting stacked pattern 10.

According to an example, the dry etching method may be one of reactive ion etching (RIE), reactive ion beam etching (RIBE), and inductively coupled plasma reactive ion etching (ICP-RIE), but the embodiments are not limited thereto. Unlike the wet etching method, the dry etching method may be suitable for forming the light emitting stacked pattern 10 because it is easy to implement one-way etching.

In order to perform the etching process on the light emitting stacked structure 5, an etching mask pattern in which a predetermined shape is arranged at intervals may be formed in a plan view. Thereafter, the light emitting stacked structure 5 may be etched in the stacking direction using the formed etching mask pattern. By performing the etching process, the light emitting stacked pattern 10 may be provided. In case that the etching process is performed, at least a portion of the light emitting stacked structure 5 may be removed to provide a groove region 21, and at least a portion of the 1-1-th semiconductor layer SEC1_1 may be exposed to the outside in the groove region 21.

Thereafter, although not shown in the drawings, an electrochemical (EC) etching process may be performed on the intermediate layer ML. According to an example, in order to perform the electrochemical etching process, a potassium hydroxide (KOH) or nitric acid (HNO$_3$) solution may be used, but the disclosure is not limited thereto.

The electrochemical etching process may be performed on the intermediate layer ML through the side surface of the light emitting stacked pattern 10. The electrochemical etching process may be selectively performed on the first doped layer 102. The speed at which the electrochemical etching process is performed may be faster as the doping concentration of a target semiconductor layer increases. In case that the electrochemical etching process is performed on the intermediate layer ML, a porous structure may be selectively formed in the first doped layer 102 having a relatively high doping concentration. For example, even if the electrochemical etching process is performed on the intermediate layer ML, the porous structure may not be formed in the second doped layer 104 having a relatively low doping concentration. Due to the porous structure formed in the first doped layer 102 of the intermediate layer ML, point defects in the first doped layer 102 may be reduced. Accordingly, leakage current in the light emitting element LD can be prevented, and the light efficiency of the light emitting element LD can be improved.

After the etching process for forming the light emitting stacked pattern 10 and/or the electrochemical etching process of the intermediate layer ML, residue (not shown) remaining on the light emitting stacked pattern 10 may be removed by a conventional removal method. The residue may be the etching mask or an insulating material used during a mask process.

Figure 13:
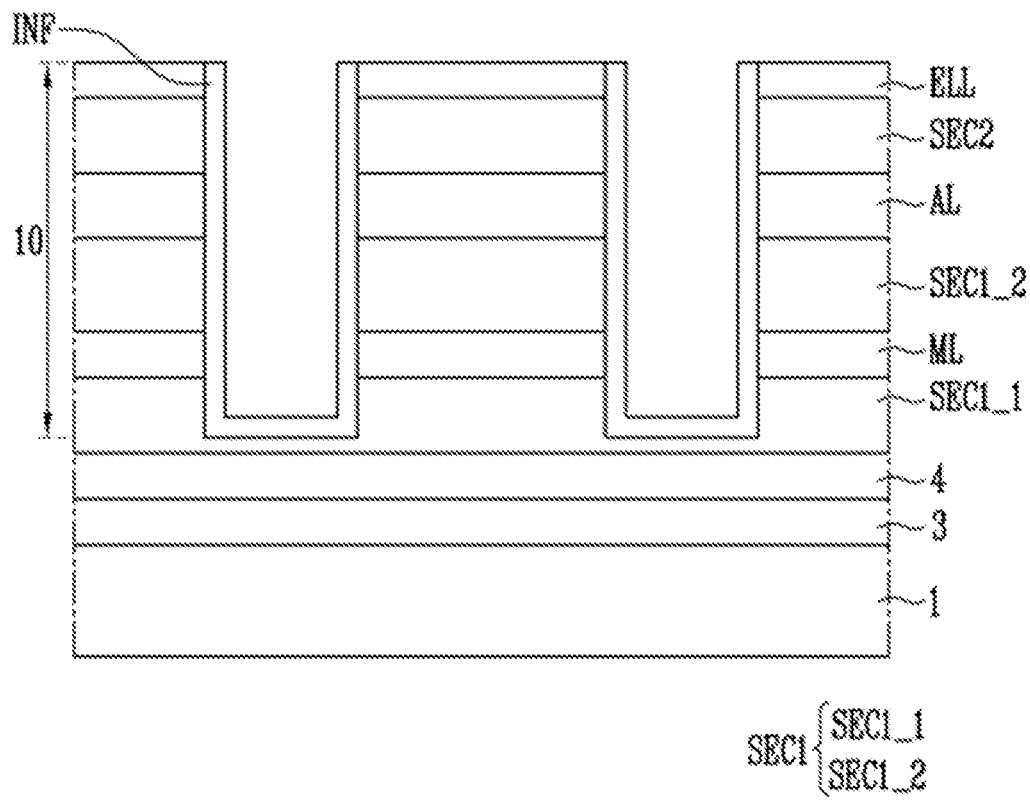

Referring to FIG. 13, an insulating film INF may be formed on the surfaces of the 1-1-th semiconductor layer SEC1_1, the intermediate layer ML, the 1-2-th semiconductor layer SEC1_2, the active layer AL, the second semiconductor layer SEC2, and the electrode layer ELL. The insulating film INF may cover or overlap at least a portion of each of the 1-1-th semiconductor layer SEC1_1, the intermediate layer ML, the 1-2-th semiconductor layer SEC1_2, the active layer AL, the second semiconductor layer SEC2, and the electrode layer ELL so that each of them is not exposed to the outside. The insulating film INF may expose the upper surface of the electrode layer ELL.

The insulating film INF may be provided by applying an insulating material onto the light emitting stacked pattern 10. As an example, the insulating film INF may be formed using an atomic layer deposition (ALD) method, a sol-gel process, or a chemical vapor deposition method (for example, a plasma-enhanced chemical vapor deposition (PECVD) method).

Figure 14:
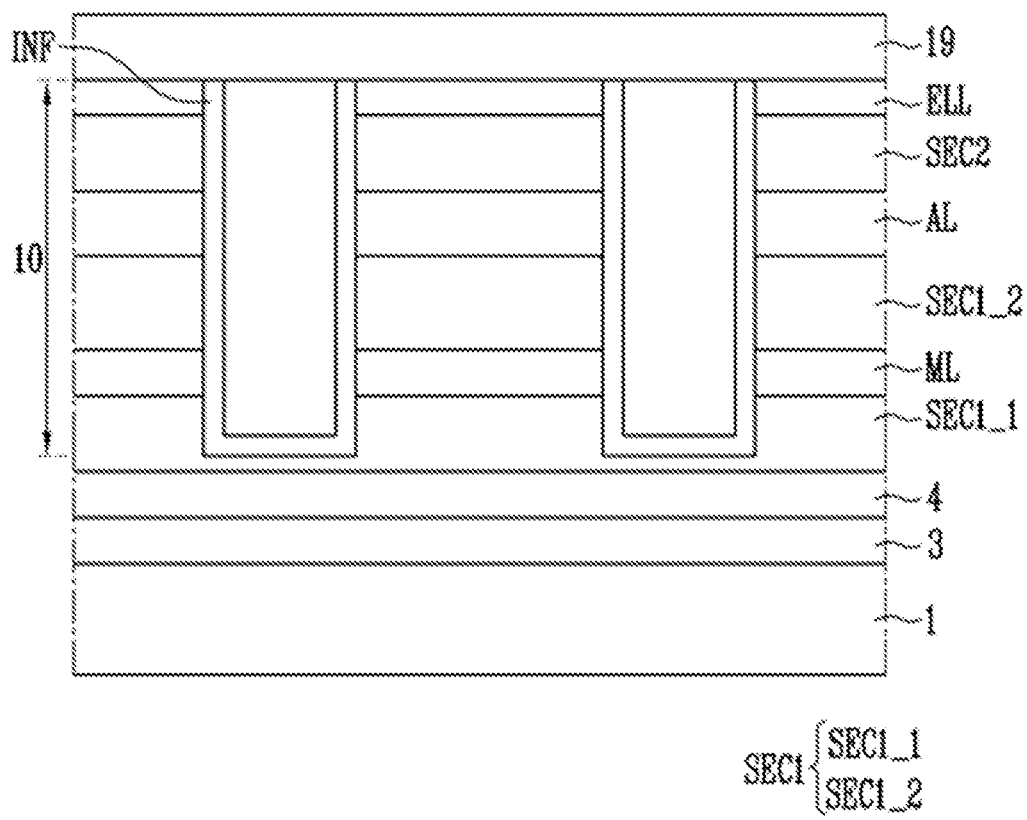

Referring to FIG. 14, a bonding layer 19 may be connected to the light emitting stacked pattern 10. Although not shown in the drawings, a first metal may be coated on the light emitting stacked pattern 10 and a second metal may be coated on a surface of the bonding layer 19 to be connected to the light emitting stacked pattern 10. The bonding layer 19 and the light emitting stacked pattern 10 may be combined by connecting the first metal and the second metal under a predetermined temperature and pressure condition. According to an embodiment, the first metal and the second metal may be Au or Sn, but the embodiments are not limited thereto. The first metal and the second metal may be a single metal or a metal material in which metals are alternately arranged with each other.

Figure 15:
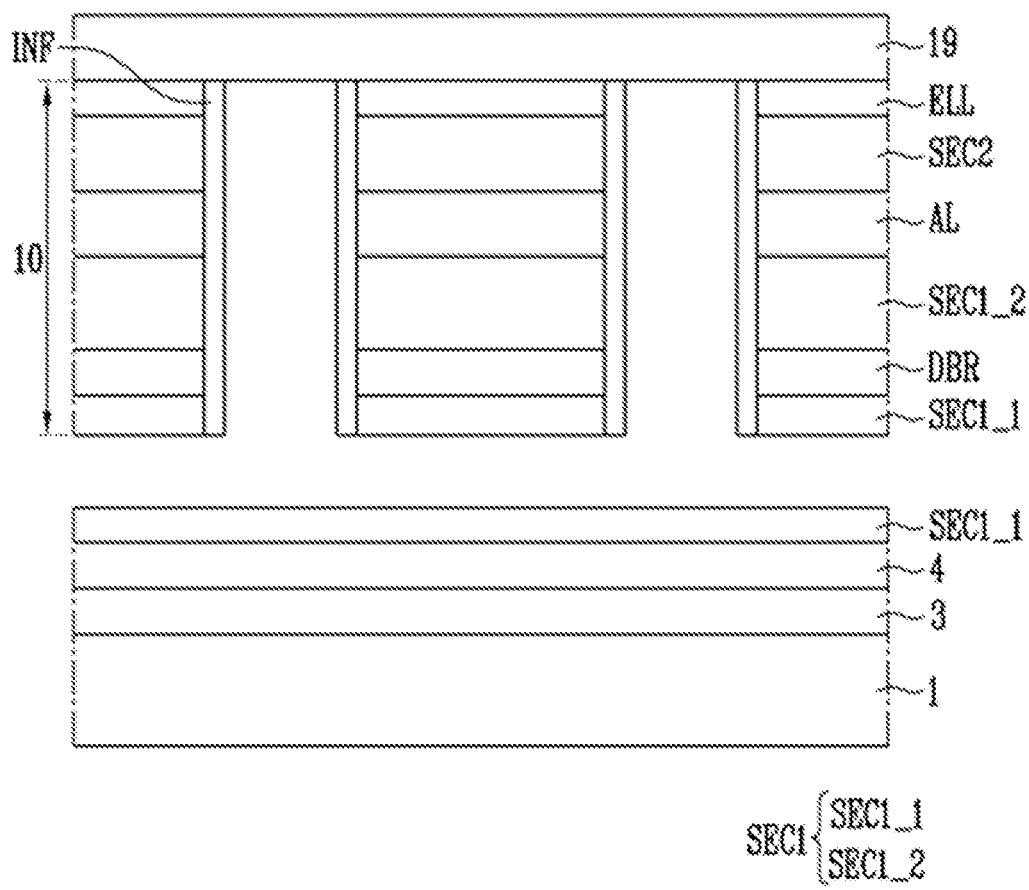

Referring to FIG. 15, the light emitting stacked pattern 10 may be separated from the stacked substrate 1, the sacrificial layer 3, and the buffer layer 4. According to an example, the light emitting stacked pattern 10 may be separated by a laser lift-off (LLO) method or a chemical lift-off (CLO) method. A physical separation process may be performed on the 1-1-th semiconductor layer SEC1_1 positioned between the light emitting stacked pattern 10 and the buffer layer 4. In case that the light emitting stacked pattern 10 is separated, at least a portion of the 1-1-th semiconductor layer SEC1_1 forming the bottom surface of the light emitting stacked pattern 10 may still be left on the buffer layer 4.

Figure 16:
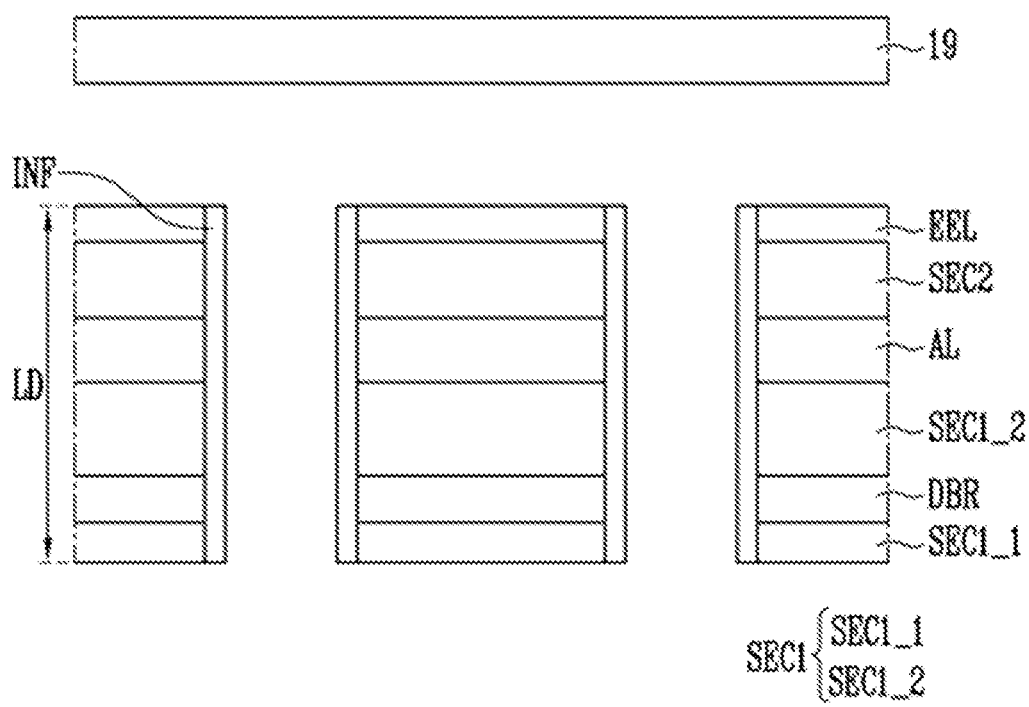

Referring to FIG. 16, the bonding layer 19 may be removed. The light emitting element LD having a predetermined shape may be provided by removing the bonding layer 19. The separated light emitting element LD may have a shape in which a surface of the electrode layer EEL, the insulating layer INF, and a surface of the 1-1-th semiconductor layer SEC1_1 are exposed to the outside. Thereafter, a process for removing impurities remaining on the surface of the light emitting element LD exposed to the outside may be performed.

Hereinafter, a display device to which the light emitting element LD according to an embodiment is applied will be described with reference to FIGS. 17 and 18.

Figure 17:
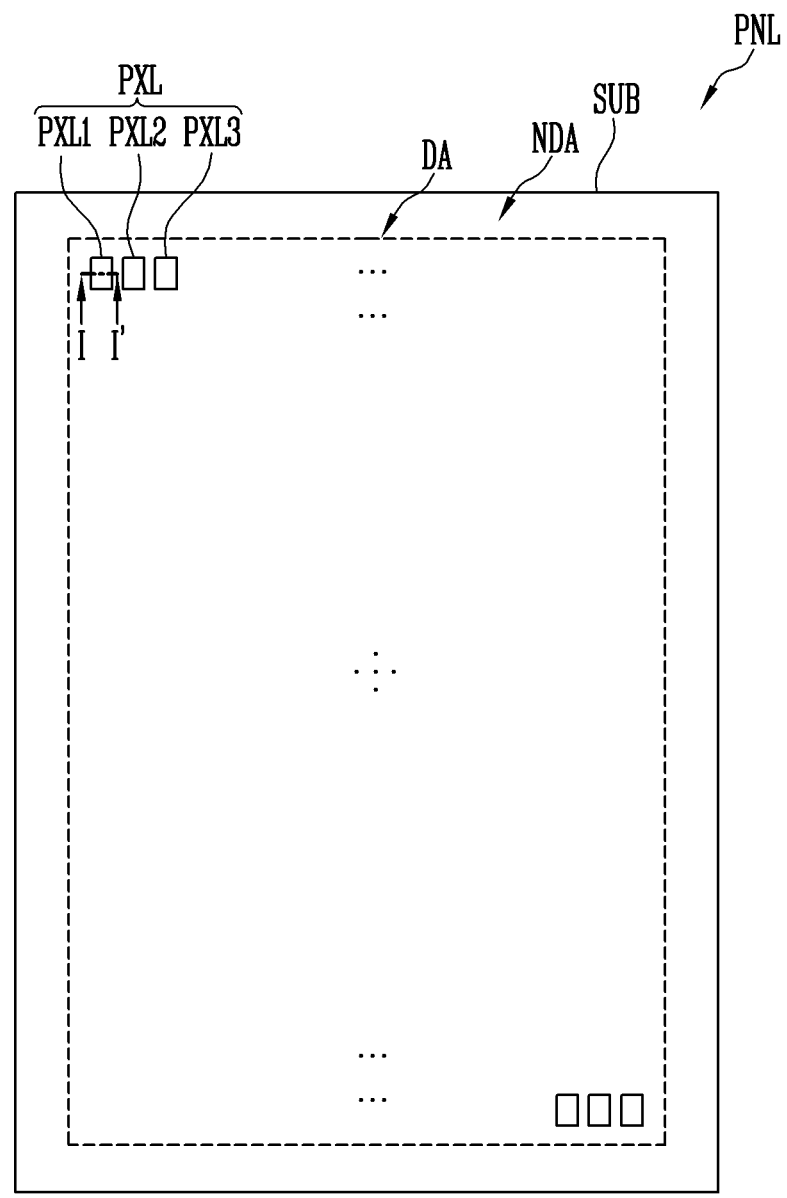
FIG. 17 is a plan view schematically illustrating a display device including the light emitting element according to an embodiment of the disclosure.
Figure 17:
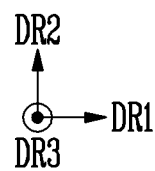

FIG. 17 is a schematic plan view illustrating a display device including the light emitting element according to an embodiment.

FIG. 17 illustrates, as an example of an electronic device using the light emitting element LD as a light source, a display device, particularly, a display panel PNL provided in the display device. FIG. 17 schematically illustrates the structure of the display panel PNL around a display area DA. However, according to an embodiment, at least one driving circuit unit (for example, at least one of a scan driver and a data driver), wirings, and/or pads, which are not shown, may be further disposed on the display panel PNL.

Referring to FIG. 17, the display panel PNL may include a substrate SUB and a pixel PXL disposed on the substrate SUB. Pixels PXL may be provided on the substrate SUB.

The substrate SUB may form (or constitute) a base member of the display panel PNL and may be a rigid or flexible substrate or film.

The display panel PNL and the substrate SUB on which the display panel PNL is formed may include a display area DA for displaying an image and a non-display area NDA excluding the display area DA.

The pixels PXL may be disposed in the display area DA. Each pixel PXL may include the light emitting element LD.

Various wirings, pads, and/or built-in circuit units electrically connected to the pixels PXL of the display area DA may be disposed in the non-display area NDA. The pixels PXL may be regularly arranged according to an arrangement structure such as a stripe or a PenTile®. However, the arrangement structure of the pixels PXL is not limited thereto, and the pixels PXL may be arranged in the display area DA in various structures and/or manners.

According to an embodiment, two or more types of pixels PXL emitting light of different colors may be disposed in the display area DA. For example, the pixel PXL may include a first pixel PXL1 that emits light of a first color, a second pixel PXL2 that emits light of a second color, and a third pixel PXL3 that emits light of a third color. The first to third pixels PXL1, PXL2, and PXL3 disposed adjacent to each other may constitute a pixel unit that emits light of various colors. For example, the first to third pixels PXL1, PXL2, and PXL3 may be subpixels each emitting light of a predetermined color. According to an embodiment, the first pixel PXL1 may be a red pixel emitting red light, the second pixel PXL2 may be a green pixel emitting green light, and the third pixel PXL3 may be a blue pixel emitting blue light, but the disclosure is not limited thereto.

In an embodiment, the first pixel PXL1, the second pixel PXL2, and the third pixel PXL3 may each include a first color light emitting element, a second color light emitting element, and a third color light emitting element as light sources. Therefore, the first pixel PXL1, the second pixel PXL2, and the third pixel PXL3 may emit light of the first color, the second color, and the third color, respectively. In an embodiment, the first pixel PXL1, the second pixel PXL2, and the third pixel PXL3 may each include light emitting elements that emit light of a same color, and color conversion layers and/or color filters of different colors may be disposed on each light emitting element. Therefore, the first pixel PXL1, the second pixel PXL2, and the third pixel PXL3 may emit light of the first color, the second color, and the third color, respectively. However, the color, type and/or number of pixels PXL constituting each pixel unit are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, each pixel PXL may be composed of an active pixel. However, the type, structure, and/or driving method of the pixels PXL applicable to the display device is not particularly limited. For example, each pixel PXL may include a pixel of a passive or active light emitting display device having various structures and/or driving methods.

Figure 18:
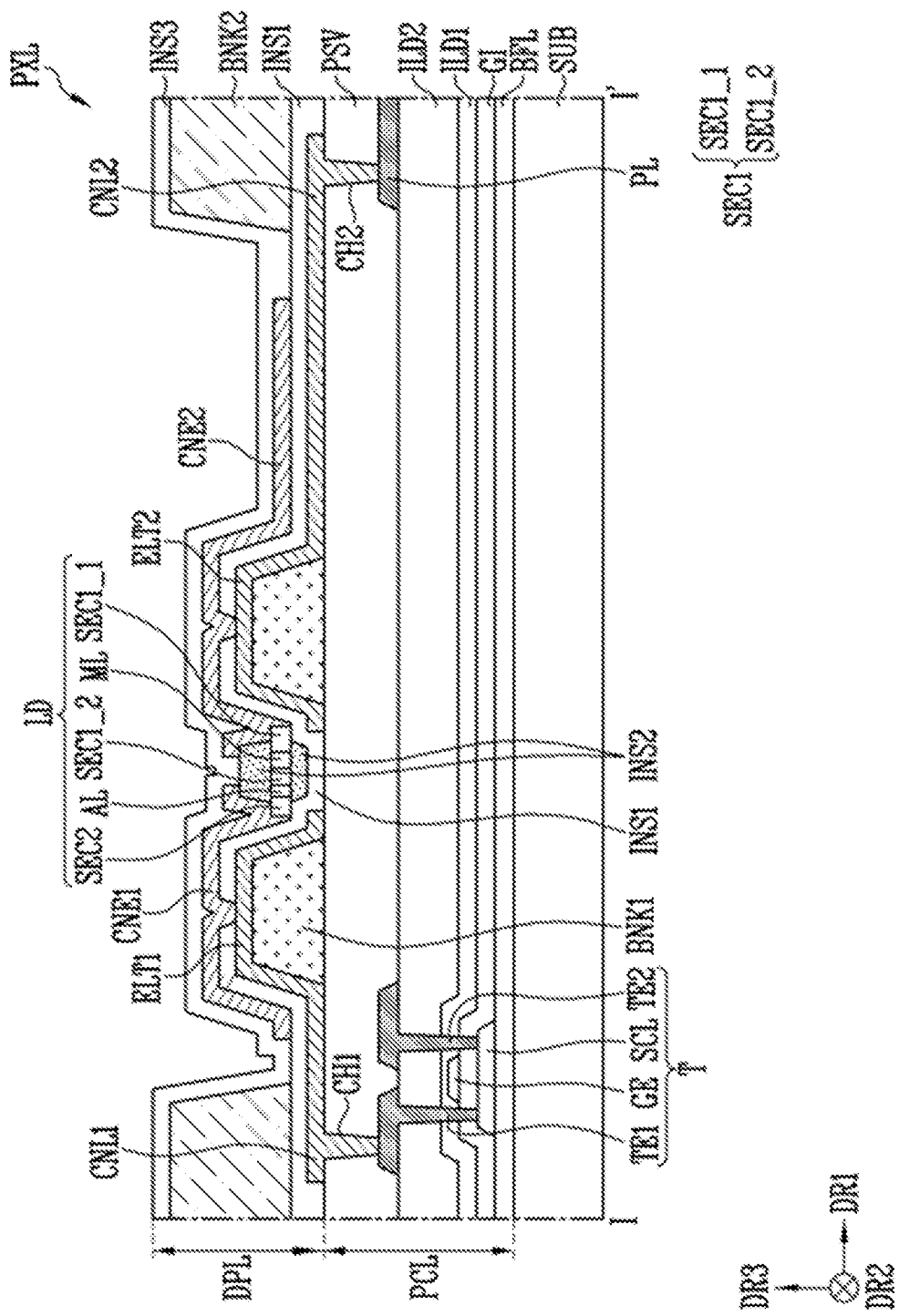
FIG. 18 is a schematic cross-sectional view taken along line I-I' of FIG. 17.

FIG. 18 is a schematic cross-sectional view taken along line I-I' of FIG. 17. Referring to FIG. 18, the pixel PXL may include the substrate SUB, a pixel circuit part PCL, and a display element part DPL.

The substrate SUB may be the rigid or flexible substrate. According to an example, the substrate SUB may include a rigid material or a flexible material. According to an example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the substrate SUB applied to the embodiment is not limited to specific examples.

The pixel circuit part PCL may be positioned on the substrate SUB. The pixel circuit part PCL may include a buffer layer BFL, a transistor T, a gate insulating layer GI, a first interlayer insulating layer ILD1, a second interlayer insulating layer ILD2, a first contact hole CH1, and a second contact hole CH2, and a passivation layer PSV.

The buffer layer BFL may be positioned on the substrate SUB. The buffer layer BFL may prevent impurities from being diffused from the outside. The buffer layer BFL may include at least one of metal oxides such as silicon nitride ($SiN_x$), silicon oxide ($SiO_x$), silicon oxynitride ($SiO_xN_y$), and aluminum oxide ($AlO_x$).

The transistor T may be a driving transistor. The transistor T may include a semiconductor pattern SCL, a gate electrode GE, a first transistor electrode TE1, and a second transistor electrode TE2.

The semiconductor pattern SCL may be positioned on the buffer layer BFL. The semiconductor pattern SCL may include at least one of polysilicon, amorphous silicon, and oxide semiconductor.

The semiconductor pattern SCL may include a first contact region electrically contacting the first transistor electrode TE1 and a second contact region electrically contacting the second transistor electrode TE2.

The first contact region and the second contact region may be a semiconductor pattern doped with impurities. A region between the first contact region and the second contact region may be a channel region. The channel region may be an intrinsic semiconductor pattern that is not doped with impurities.

The gate insulating layer GI may be provided on the semiconductor pattern SCL. The gate insulating layer GI may include an inorganic material. According to an example, the gate insulating layer GI may include at least one of silicon nitride ($SiN_x$), silicon oxide ($SiO_x$), silicon oxynitride ($SiO_xN_y$), and aluminum oxide ($AlO_x$). According to an embodiment, the gate insulating layer GI may include an organic material.

The gate electrode GE may be positioned on the gate insulating layer GI. The position of the gate electrode GE may correspond to that of the channel region of the semiconductor pattern SCL. For example, the gate electrode GE may be disposed on the channel region of the semiconductor pattern SCL with the gate insulating layer GI interposed therebetween.

The first interlayer insulating layer ILD1 may be positioned on the gate electrode GE. Similar to the gate insulating layer GI, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be positioned on the first interlayer insulating layer ILD1. The first transistor electrode TE1 may pass through the gate insulating layer GI and the first interlayer insulating layer ILD1 to electrically contact the first contact region of the semiconductor pattern SCL, and the second transistor electrode TE2 may pass through the gate insulating layer GI and the first interlayer insulating layer ILD1 to electrically contact the second contact region of the semiconductor pattern SCL. The first transistor electrode TE1 may be electrically connected to a first connection line CNL1 through a first contact hole CH1 penetrating the passivation layer PSV. According to an embodiment, the first transistor electrode TE1 may be a source electrode, and the second transistor electrode TE2 may be a drain electrode.

The second interlayer insulating layer ILD2 may be positioned on the first transistor electrode TE1 and the second transistor electrode TE2. Similar to the first interlayer insulating layer ILD1 and the gate insulating layer GI, the second interlayer insulating layer ILD2 may include the inorganic material. The inorganic material may be one or more materials forming (or constituting) the first interlayer insulating layer ILD1 and the gate insulating layer GI, and may include, for example, at least one of silicon nitride ($SiN_x$), silicon oxide ($SiO_x$), silicon oxynitride ($SiO_xN_y$), and aluminum oxide ($AlO_x$). According to an embodiment, the second interlayer insulating layer ILD2 may include an organic material.

A power source line PL may be disposed on the second interlayer insulating layer ILD2. The power source line PL may be electrically connected to a second connection line CNL2 through a second contact hole CH2 penetrating the passivation layer PSV. Power may be supplied to the power source line PL, and the supplied power may be provided to the second connection line CNL2 through the second contact hole CH2.

The passivation layer PSV may be positioned on the second interlayer insulating layer ILD2. The passivation layer PSV may cover or overlap the power source line PL. The passivation layer PSV may include an organic insulating layer, an inorganic insulating layer, or an organic insulating layer disposed on the inorganic insulating layer.

The display element part DPL may include a first bank BNK1, a first electrode ELT1, a second electrode ELT2, a first insulating layer INS1, a light emitting element LD, a first contact electrode CNE1, a second contact electrode CNE2, a second insulating layer INS2, a second bank BNK2, and a third insulating layer INS3.

The first bank BNK1 may have a shape protruding upward, and the first electrode ELT1 and the second electrode ELT2 may be arranged on the first bank BNK1 to form a reflective partition wall. The reflective partition wall may be formed to improve the light efficiency of the light emitting element LD.

A portion of the first electrode ELT1 may be arranged on the passivation layer PSV, and another portion of the first electrode ELT1 may be arranged on the first bank BNK1. The first electrode ELT1 may be a path through which electrical information on the light emitting element LD applied through the first connection line CNL1 may be provided. A portion of the second electrode ELT2 may be arranged on the passivation layer PSV, and another portion of the second electrode ELT2 may be arranged on the first bank BNK1. The second electrode ELT2 may be a path through which electrical information on the light emitting element LD applied through the second connection line CNL2 may be provided.

The first insulating layer INS1 may be positioned on the passivation layer PSV. The first insulating layer INS1 may include at least one of silicon nitride ($SiN_x$), silicon oxide ($SiO_x$), silicon oxynitride ($SiO_xN_y$), and aluminum oxide ($AlO_x$).

At least a portion of the first insulating layer INS1 may be disposed on the first contact electrode CNE1, the second contact electrode CNE2, the first electrode ELT1, and/or the second electrode ELT2 to stabilize an electrical connection and reduce external influences.

The light emitting element LD may be positioned on the first insulating layer INS1. According to an example, the first insulating layer INS1 may have a groove, at least a portion of the light emitting element LD may contact an end formed by the groove, and another portion of the light emitting element LD may contact another end formed by the groove.

The light emitting element LD may be positioned on the first insulating layer INS1 between the first electrode ELT1 and the second electrode ELT2. The light emitting element LD may be the light emitting element LD described above with reference to FIGS. 1 and 2.

The second insulating layer INS2 may be positioned on the light emitting element LD. The second insulating layer INS2 may be formed to cover or overlap an area corresponding to the active layer AL of the light emitting element LD. The second insulating layer INS2 may include at least one of an organic material or an inorganic material.

According to an embodiment, at least a portion of the second insulating layer INS2 may be positioned on the rear surface of the light emitting element LD. The second insulating layer INS2 formed on the rear surface of the light emitting element LD may be formed to fill a gap between the first insulating layer INS1 and the light emitting element LD in a process of forming the second insulating layer INS2 on the light emitting element LD.

The first contact electrode CNE1 and the second contact electrode CNE2 may be positioned on the first insulating layer INS1. The first contact electrode CNE1 and the second contact electrode CNE2 may be electrically connected to the first electrode ELT1 and the second electrode ELT2, respectively, through contact holes formed in the first insulating layer INS1.

The first contact electrode CNE1 may include a transparent conductive material. According to an example, the first contact electrode CNE1 may include at least one of conductive materials including indium tin oxide (ITO), indium zinc oxide (IZO), and indium tin zinc oxide (ITZO).

The second contact electrode CNE2 may include a conductive material. The second contact electrode CNE2 may include an opaque conductive material. The second contact electrode CNE2 may include a conductive material having a relatively lower work function than the transparent conductive material. According to an example, the second contact electrode CNE2 may be an alloy containing aluminum (Al).

Light emitted from the active layer AL of the light emitting element LD may be output to the outside. The light emitted from the active layer AL may be provided in a direction from the active layer AL toward the second semiconductor layer SEC2. For example, the light provided from the active layer AL may include first light directed to the first semiconductor layer SEC1 and second light directed to the second semiconductor layer SEC2. The first light may be reflected by an intermediate layer ML and directed toward the second semiconductor layer SEC2. Accordingly, the second contact electrode CNE2 may not contain the transparent conductive material. For this reason, the second contact electrode CNE2 may include the conductive material having the relatively lower work function, and the electrical characteristics of the light emitting element LD may be improved.

An electrical signal provided through the first electrode ELT1 may be provided to the light emitting element LD through the first contact electrode CNE1. The light emitting element LD may emit light based on the provided electrical signal. An electrical signal provided through the second electrode ELT2 may be provided to the light emitting element LD through the second contact electrode CNE2.

The second bank BNK2 may be a structure defining an emission region of the pixel PXL. The emission region may mean a region in which light is emitted from the light emitting element LD. For example, the second bank BNK2 may be disposed at a boundary between adjacent pixels PXL.

The third insulating layer INS3 may be arranged on the second bank BNK2, the first contact electrode CNE1, the second contact electrode CNE2, and the second insulating layer INS2. The third insulating layer INS3 may include one of an organic material and an inorganic material. The third insulating layer INS3 may protect the display element part DPL from external influences.

The arrangement relationship related to the light emitting element LD, electrode configuration, and the like is not limited to the embodiment described above with reference to FIG. 18, and arrangement relationships according to various modified embodiments may be implemented.

According to the embodiment, a light emitting element in which the light emitting efficiency is improved and a degree of freedom in selecting a material of an electrode can be secured, a method of manufacturing the same, and a display device including the same, may be provided.

Effects of the disclosure are not limited to the above-described effects, and effects that are not mentioned may be clearly understood by those skilled in the art from the specification and the accompanying drawings.

The above-described descriptions are merely illustrative of the technical spirit of the disclosure. Those skilled in the art will appreciate that various modifications and changes can be made to the disclosure without departing from the spirit and scope of the disclosure. Therefore, the embodiments of the disclosure described above may be implemented separately or in combination.

Therefore, the embodiments disclosed in the specification are not intended to limit the technical spirit of the disclosure, but to explain the technical spirit. The scope of the technical spirit of the disclosure is not limited by these embodiments. The scope of protection of the disclosure should be interpreted by the appended claims, and all technical spirits within the scope equivalent thereto should be construed as being included in the scope of the disclosure.

What is claimed is:

1. A light emitting element comprising:
   a first semiconductor layer including a first type of semiconductor doped with a first conductivity type dopant, the first semiconductor layer including:
      a 1-1-th semiconductor layer doped with the first conductivity type dopant; and
      a 1-2-th semiconductor layer doped with the first conductivity type dopant, which are arranged in a length direction of the light emitting element;
   a second semiconductor layer including a second type of semiconductor different from the first type;
   an active layer disposed between the 1-2-th semiconductor layer and the second semiconductor layer; and
   an intermediate layer disposed between the 1-1-th semiconductor layer and the 1-2-th semiconductor layer and having a porous structure; wherein
   the first semiconductor layer, the second semiconductor layer, the active layer, and the intermediate layer each comprise a corresponding outer peripheral surface aligned in the length direction, and
   the outer peripheral surfaces are vertically aligned forming the light emitting element in a columnar shape in the length direction.

2. The light emitting element of claim 1, wherein the intermediate layer includes:
   a first doped layer doped with the first conductivity type dopant having a first concentration; and
   a second doped layer doped with the first conductivity type dopant having a second concentration less than the first concentration.

3. The light emitting element of claim 2, wherein the first doped layer and the second doped layer are alternately arranged in the length direction.

4. The light emitting element of claim 1, wherein the intermediate layer includes at least one of GaN, InGaN, and InN.

5. The light emitting element of claim 2, wherein a thickness of the first doped layer is greater than a thickness of the second doped layer.

6. The light emitting element of claim 2, wherein the first concentration is 10 times the second concentration or more.

7. The light emitting element of claim 2, wherein
   the first concentration is about $10^{18}$ cm$^{-3}$ or more, and
   the second concentration is about $10^{17}$ cm$^{-3}$ or less.

8. The light emitting element of claim 2, wherein
   the first doped layer has a first thickness ($T_1$) that satisfies Equation 1, and
   the second doped layer has a second thickness ($T_2$) that satisfies Equation 2, wherein
   Equation 1 is defined as follows:

$$T_1 = \frac{\lambda m}{4n_1}$$

wherein $n_1$ is a refractive index of the first doped layer, $\lambda$ is a wavelength [nm] of light emitted from the active layer, m=2h$_1$−1, and h$_1$ is an integer greater than or equal to 1, and
   Equation 2 is defined as follows:

$$T_2 = \frac{\lambda m}{4n_2}$$

wherein $n_2$ is a refractive index of the second doped layer, $\lambda$ is the wavelength [nm] of the light emitted from the active layer, m=2h$_2$−1, and h$_2$ is an integer greater than or equal to 1.

9. The light emitting element of claim 8, wherein a thickness of the intermediate layer is in a range of about 1 μm to about 2 μm.

10. The light emitting element of claim 9, wherein
    the sum of thicknesses of the intermediate layer, the 1-1-th semiconductor layer, and the 1-2-th semiconductor layer is 3 μm or more.

11. The light emitting element of claim 1, wherein the intermediate layer reflects light emitted from the active layer in a direction from the first semiconductor layer toward the second semiconductor layer.

12. The light emitting element of claim 1, further comprising an insulating film completely surrounding the outer peripheral surfaces and extending in the length direction.

13. A display device comprising:
    a substrate; and
    a display element part including:
       a light emitting element disposed on the substrate and emitting light;
       a first contact electrode electrically connected to an end of the light emitting element; and
       a second contact electrode electrically connected to another end of the light emitting element, wherein the light emitting element includes:
- a first semiconductor layer including a first type of semiconductor doped with a first conductivity type dopant, the first semiconductor layer including:
  - a 1-1-th semiconductor layer doped with the first conductivity type dopant; and
  - a 1-2-th semiconductor layer doped with the first conductivity type dopant, which are arranged in a length direction of the light emitting element;
- a second semiconductor layer including a second type of semiconductor different from the first type;
- an active layer disposed between the 1-2-th semiconductor layer and the second semiconductor layer; and
an intermediate layer disposed between the 1-1-th semiconductor layer and the 1-2-th semiconductor layer and having a porous structure; wherein
the first semiconductor layer, the second semiconductor layer, the active layer, and the intermediate layer each comprise a corresponding outer peripheral surface aligned in the length direction, and
the outer peripheral surfaces are vertically aligned forming the light emitting element in a columnar shape in the length direction.

14. The display device of claim 13, wherein
the first contact electrode includes an opaque conductive material and is electrically connected to the 1-1-th semiconductor layer, and
the second contact electrode includes a transparent conductive material and is electrically connected to the 1-2-th semiconductor layer.

15. The display device of claim 14, wherein the intermediate layer includes:
- a first doped layer doped with the first conductivity type dopant having a first concentration; and
- a second doped layer doped with the first conductivity type dopant having a second concentration less than the first concentration.

16. The light emitting element of claim 1, wherein
the second semiconductor layer is doped with a second conductivity type dopant different from the first conductivity type dopant.

17. The light emitting element of claim 16, wherein
the intermediate layer comprises first doped layers and second doped layers alternately arranged in the length direction;
the first doped layer and the second doped layer each including the first type of semiconductor doped with the first conductivity type dopant;
the first doped layer doped with the first conductivity type dopant having a first concentration; and
the second doped layer doped with the first conductivity type dopant having a second concentration less than the first concentration.

* * * * *